United States Patent
Lam et al.

(10) Patent No.: US 10,684,118 B1
(45) Date of Patent: Jun. 16, 2020

(54) APPARATUS FOR DETERMINING AN ORIENTATION OF A DIE

(71) Applicant: ASM Technology Singapore Pte Ltd, Singapore (SG)

(72) Inventors: Kai Siu Lam, Hong Kong (HK); Chi Leung Mok, Hong Kong (HK); Nim Tak Wong, Hong Kong (HK); Ka Yee Mak, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/378,758

(22) Filed: Apr. 9, 2019

(51) Int. Cl.
*G01B 11/00* (2006.01)
*G01B 5/008* (2006.01)
*H01L 21/68* (2006.01)

(52) U.S. Cl.
CPC ........... *G01B 11/005* (2013.01); *G01B 5/008* (2013.01); *H01L 21/681* (2013.01)

(58) Field of Classification Search
CPC ..... G01B 11/002; G01B 11/005; G01B 11/02; G01B 11/028; G01B 11/03; G01B 11/04; G01B 11/043; G01B 11/046; G01B 11/08; G01B 11/10; G01B 11/105; G01B 11/14; G01B 5/004; G01B 5/008; G01B 5/012; G01B 5/016; G01B 5/02; G01B 5/04; G01B 5/043; G01B 5/046; H01L 33/005; H01L 21/677; H01L 21/67721; H01L 21/68; H01L 21/681; G03F 9/00; G03F 9/70; G03F 9/7069; G03F 9/7073–9/7096; G03F 7/70633; G03F 7/70666; G03F 7/70683; G03F 7/70775; G03F 7/70791; G03F 7/7085

USPC ........ 356/614–640, 399–401; 438/106, 107, 438/108, 51; 257/48, 88, 676, 678; 355/53, 55, 67–77, 52; 382/106, 141, 382/143, 145–152
See application file for complete search history.

(56) References Cited

U.S. PATENT DOCUMENTS

| | | | | |
|---|---|---|---|---|
| 5,307,154 A * | 4/1994 | Naemura | ............... | G01D 5/342 356/400 |
| 5,583,904 A * | 12/1996 | Adams | ................. | G01N 23/046 378/22 |
| 5,594,768 A * | 1/1997 | Fujii | .................... | H05K 13/082 378/21 |
| 6,589,809 B1 * | 7/2003 | Koopmans | ........ | H01L 21/67121 438/113 |
| 7,141,450 B2 * | 11/2006 | Pardo | .................... | G01B 11/27 438/108 |

(Continued)

*Primary Examiner* — Christina A Riddle
(74) *Attorney, Agent, or Firm* — Ostrolenk Faber LLP

(57) ABSTRACT

An apparatus for determining an orientation of a die mounted on a tape includes an imaging device, a light source and a conveying mechanism. The die is at least partially translucent and includes at least one orientation feature indicative of the orientation of the die. In use, the conveying mechanism conveys the tape to position the die at an inspection position between the imaging device and the light source. The light source projects light to the imaging device and the imaging device captures an image. The projected light from the light source passing through the die is obstructed by the at least one orientation feature of the die to cause the captured image to include an image of the at least one orientation feature, whereby the orientation of the die may be determined.

17 Claims, 6 Drawing Sheets

(56) References Cited

U.S. PATENT DOCUMENTS

| | | | |
|---|---|---|---|
| 9,555,979 B2* | 1/2017 | Courts | H01L 21/67132 |
| 2003/0113009 A1* | 6/2003 | Mueller | G06T 7/0002 |
| | | | 382/147 |
| 2008/0170239 A1* | 7/2008 | Uemura | G03F 7/70791 |
| | | | 356/620 |

* cited by examiner

APPARATUS FOR DETERMINING AN ORIENTATION OF A DIE

FIELD OF THE INVENTION

The present invention relates to an apparatus for determining an orientation of a die, such as a red, green or blue (RGB) LED die.

BACKGROUND OF THE INVENTION

The fabrication process of an electronic device often includes bonding a die onto a carrier substrate or a circuit board. In some cases, the orientation of the die with respect to the other components on the carrier substrate or the circuit board is important as the electronic device may not work if the orientation of the die is incorrect. Therefore, to ensure that the die is bonded in a correct manner, the orientation of the die is usually determined prior to the bonding process.

To facilitate the determination of the orientation of the die, certain types of dies, such as an RGB LED die, may include orientation features (or polarity mark features) indicative of the orientation of the die. Several prior art methods have been developed to determine the orientation of a die by inspecting the orientation features included in the die. These usually involve capturing an image of the die using a camera and inspecting the orientation features shown in the image. For certain types of dies, the orientation features are located on a top surface of the die and an image captured by a down-look camera above the die can show the orientation features quite clearly. The orientation of such a die can thus be determined in a relatively straightforward manner. However, for some other types of dies (for example, a flip chip LED die having a size ranging from about 3×5 mil to about 5×9 mil), the orientation features may be located on a bottom surface of the die or within the die. In these cases, it may be more difficult to capture a clear image of the orientation features as the line of vision between the camera and the die may be blocked by the other parts of the die and/or by the tape on which the die is mounted.

FIG. 1A shows examples of respective LED dies 100 having first, second and third orientation features 102b, 104b, 106b within the dies 100. In particular, FIG. 1A shows a top view of the LED dies 100 as captured by an optical microscope and FIG. 1B shows a cross-sectional view of one LED die 100. As shown in FIG. 1A, the LED dies 100 include a red LED 102, a green LED 104 and a blue LED 106. The red LED 102 includes a pair of first electrodes 102a and the first orientation feature 102b, the green LED 104 includes a pair of second electrodes 104a and the second orientation feature 104b, and the blue LED 106 includes a pair of third electrodes 106a and the third orientation feature 106b. The first, second and third orientation features 102b, 104b and 106b are indicative of the orientations of the red LED 102, the green LED 104 and the blue LED 106 respectively. As more clearly shown in FIG. 1B, the LED die 100 includes an epitaxy layer 108 arranged over the electrodes 102a, 104a, 106a. In the LED dies 100 as shown in FIG. 1A, the orientation features 102b, 104b, 106b are located within the die 100, in particular, within the epitaxy layer 108 (although, in other types of LED dies, the orientation features 102b, 104b, 106b may be located within the electrodes 102a, 104a, 106a respectively). The LED die 100 further includes a sapphire layer 110 on which the epitaxy layer 108 is arranged. The electrodes 102a, 104a, 106a are in the form of metal layers which are opaque. The orientation features 102b, 104b, 106b are also substantially opaque. On the other hand, the epitaxy layer 108 and the sapphire layer 110 are translucent.

FIG. 2A shows a cross-sectional view of a prior art apparatus 200 configured to determine an orientation of the LED die 100. Referring to FIG. 2A, the prior art apparatus 200 includes a down-look camera 202 and a top-down lighting module 204 attached to a side of the down-look camera 202. In use, the LED die 100 is mounted on a mylar tape 206 with the electrodes 102a, 104a, 106a in contact with the mylar tape 206. The mylar tape 206 is conveyed to move the LED die 100 to a position below the down-look camera 202 as shown in FIG. 2A. While the LED die 100 is at this position, the lighting module 204 projects coaxial light rays 208 (e.g. white light rays) downwards onto the LED die 100. This serves to provide general lighting so that the top surface of the mylar tape 206 and the general outlines of the LED die 100 are visible to the down-look camera 202. Light rays from the lighting module 204 are reflected by the orientation features 102b, 104b, 106b to reach the down-look camera 202 and an image of the LED die 100 is captured by the down-look camera 202. FIG. 2B is an example of images 220 of the LED die 100 captured by the down-look camera 202 of the apparatus 200. As shown in FIG. 2B, the images 220 contain a high amount of noise and the orientation features 102b, 104b, 106b are hardly visible. This is because a large part of the light rays reflected by the orientation features 102b, 104b, 106b are refracted by the sapphire layer 110 of the die 100 and/or scattered at the interface between the sapphire layer 110 and the epitaxial layer 108 due to geometric effects (see for example reflected light ray 210). Therefore, these light rays do not reach the down-look camera 202. The intensity of light reaching the down-look camera 202 is hence much lower as compared to the intensity of light originating from the lighting module 204. Accordingly, the captured image 220 is of a poor quality. Thus, it can be difficult to accurately determine the orientation of the die 100 using the prior art apparatus 200. Further, the orientation features 102b, 104b, 106b are usually small as compared to the size of the respective LEDs 102, 104, 106. For example, each LED 102, 104, 106 may have a cross-sectional area of about 220 μm×130 μm, whereas each orientation feature 102b, 104b, 106b may have a diameter ranging from about 40 μm to about 60 μm. This increases the difficulty in inspecting the orientation features 102b, 104b, 106b in noisy images.

SUMMARY OF THE INVENTION

The present invention aims to provide a new and useful apparatus for determining an orientation of a die.

According to an aspect of the present invention, there is provided an apparatus for determining an orientation of a die mounted on a tape, wherein the die is at least partially translucent and includes at least one orientation feature indicative of the orientation of the die and wherein the apparatus includes: an imaging device configured to capture an image of the die; a light source configured to project light towards the imaging device; and a conveying mechanism operative to convey the tape to position the die at an inspection position between the imaging device and the light source, such that the projected light from the light source passing through the die is obstructed by the at least one orientation feature of the die to cause the captured image to include an image of the at least one orientation feature, whereby the orientation of the die is determinable.

By providing the above-mentioned apparatus, a higher quality image showing more clearly the at least one orientation feature can be captured by the imaging device. This is because the light source is configured to project light to the imaging device (as opposed to prior art apparatuses where the light source is configured to project light to the die and the light is then reflected to the imaging device). Accordingly, a higher intensity of light can reach the imaging device and a clearer image may be obtained. Furthermore, the die remains mounted on the tape while at the inspection position (in other words, there is no need to remove the die from the tape). This allows real time inspection of the dies during the manufacturing process of the electronic devices. In turn, the productivity of the manufacturing process can increase.

The apparatus may further include a holding unit configured to hold the light source. The holding unit may include an opening and the light source may be configured to project light through the opening. The opening of the holding unit can help focus the projected light towards the die and in turn, a clearer image can be captured. For example, the holding unit may be an ejector unit operative to urge the die away from the tape. Such an ejector unit is already present in several existing apparatuses and thus, this can remove the need to include an additional unit to hold the light source.

The imaging device and the inspection position may lie within a viewing cone centred at the opening of the holding unit. For example, the imaging device, the inspection position and the opening of the holding unit may be arranged along an axis perpendicular to the tape. This helps to focus the light from the light source towards the imaging device.

The imaging device and the light source may be arranged on opposite sides of the tape. For example, the light source may be arranged below the tape and the imaging device may be arranged above the tape. Since the at least one orientation feature of the die is often located nearer the bottom of the die, arranging the light source below the tape can help reduce the amount of distortion in the projected light before the projected light reaches the at least one orientation feature. This can help improve the quality of the image captured by the imaging device. Further, most existing apparatuses already include an imaging device above the tape and thus, the aforementioned arrangement of the imaging device and the light source can reduce the amount of modification required to existing apparatuses.

The light source may include a plurality of light emitting elements configured to project a plurality of light rays. This can help increase the intensity of the projected light, which can in turn improve the quality of the image captured by the imaging device. For example, the projected plurality of light rays may intersect one another. In a more specific example, the projected plurality of light rays may intersect one another above the die at the inspection position. Alternatively, the projected plurality of light rays may be spaced apart from one another. For example, the projected plurality of light rays may form a fan shape.

The light emitting elements may be arranged symmetrically about an axis along which the imaging device, the inspection position and the opening of the holding unit are arranged. This allows the intensity of the projected light through the die to be more balanced, in turn achieving a captured image of higher quality.

A distance between the inspection position and the opening of the holding unit may range from 0 mm to 2 mm. By arranging the opening of the holding unit nearer the inspection position, there may be less distortion to the projected light before the projected light reaches the die.

BRIEF DESCRIPTION OF THE FIGURES

Embodiments of the invention will now be illustrated for the sake of example only with reference to the following drawings, in which.

DETAILED DESCRIPTION OF THE EMBODIMENTS

Figure 3:
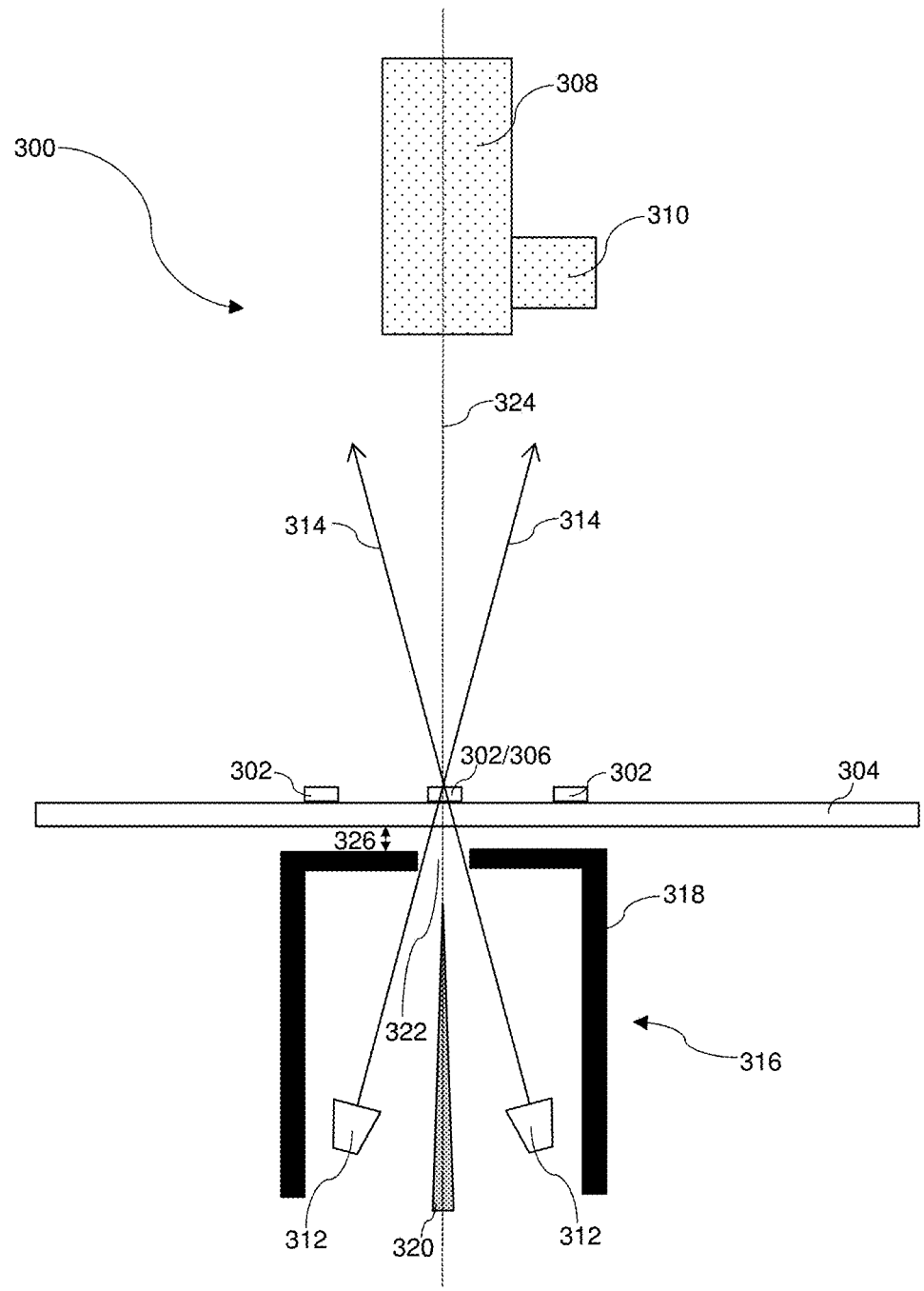
FIG. 3 shows a cross-sectional view of an apparatus for determining an orientation of a die mounted on a tape according to an embodiment of the present invention.

FIG. 3 shows a cross-sectional view of an apparatus 300 for determining an orientation of a die 302 mounted on a tape 304 according to an embodiment of the present invention. The tape 304 is in the form of a mylar tape. The die 302 includes transparent components and opaque components, with the opaque components including at least one orientation feature indicative of the orientation of the die 302. The apparatus 300 may be part of a die sorter and die attach machine.

The apparatus 300 includes an imaging device 308 in the form of a down-look camera configured to capture an image. A lighting module 310 is attached to a side of the imaging device 308. The apparatus 300 further includes a light source configured to project light to the imaging device 308. In particular, the light source includes a plurality of light emitting elements 312 configured to project a plurality of light rays 314 to the imaging device 308. Although not shown in FIG. 3, the apparatus 300 further includes a conveying mechanism configured to convey the tape 304 to position the die 302 at an inspection position 306 between the imaging device 308 and the light source.

The apparatus 300 also includes a holding unit 316 configured to hold the light source. In the apparatus 300, the holding unit 316 is in the form of an ejector unit operative to urge the die 302 away from the tape 304 and the light source is in the form of a back light source within the ejector unit. As shown in FIG. 3, the holding unit 316 includes a cover 318 in the form of an ejector cap, and an ejector pin 320 located within the cover 318. The holding unit 316 further includes an opening 322 located on a top surface of the cover 318 below the inspection position 306. The ejector pin 320 is operative to move through the opening 322 to contact and lift the die 302, so as to urge the die 302 away from the tape 304. This helps to facilitate the retrieval of the die 302 by a pick-up element to transfer the die 302 to another location for further processing. The light source is configured to project light through the opening 322 of the cover 318.

As shown in FIG. 3, the light source and the inspection position 306 are arranged under an optical viewing area of the imaging device 308. In particular, the imaging device 308, the inspection position 306 and the opening 322 of the holding unit 316 are adjusted along a vertical axis 324 perpendicular to the horizontal tape 304. The imaging device 308 and the inspection position 306 hence lie within a viewing cone centred at the opening 322 of the holding unit 316. Further, the imaging device 308 and the light source are arranged on opposite sides of the tape 304. More specifically, the light source is arranged below the tape 304 and the imaging device 308 is arranged above the tape 304. As shown in FIG. 3, the light emitting elements 312 are arranged symmetrically about the vertical axis 324.

In use, the conveying mechanism conveys the tape 304 to position each die 302 at the inspection position 306. While the die 302 is at the inspection position 306, the lighting module 310 projects white coaxial light rays downwards to provide general lighting, so that the top surface of the tape 304 and the general outlines of the die 302 are visible to the imaging device 308. At the same time, the light emitting elements 312 project a plurality of light rays 314 upwards to the imaging device 308. In particular, the plurality of light rays 314 pass through the tape 304 to a bottom surface of the die 302 at the inspection position 306, and then through the die 302 to the imaging device 308. In the embodiment as shown in FIG. 3, the projected plurality of light rays 314 intersect one another above the die 302 at the inspection position 306. An image of the die 302 at the inspection position 306 is then captured by the imaging device 308. The inspection position 306 is between the imaging device 308 and the light source such that the projected light from the light emitting elements 312 is blocked by the at least one orientation feature of the die 302 to cause the captured image (of the die 302 at the inspection position 306) to include an image of the at least one orientation feature. This captured image is then used to inspect the at least one orientation feature to determine an orientation of the die 302.

The apparatus 300 may be used for determining an orientation of any type of die 302 that includes at least one orientation feature. For example, the die 302 may be flip chip LED die configured to project light of a visible wavelength. In a more specific example, the die 302 may be an LED die 100 shown in FIG. 1A. The at least one orientation feature of the die 302 may be located at an epitaxy layer (for example, at the epitaxy layer 108 in FIG. 1B) or within electrodes of the die 302 (for example, within the electrodes 102a, 104a, 106a in FIG. 1B). Further, the die 302 may be of any size, in particular of sizes below 1×1 mm.

As described above, when using the apparatus 300, the light source projects light to the imaging device 308. In other words, the light rays 314 from the light emitting elements 312 are directed at the imaging device 308 and thus, the intensity of light reaching the imaging device 308 does not differ greatly from the intensity of light originating from the light emitting elements 312. This helps to achieve a better quality image that can more clearly show the at least one orientation feature of the die 302.

Figure 1A:
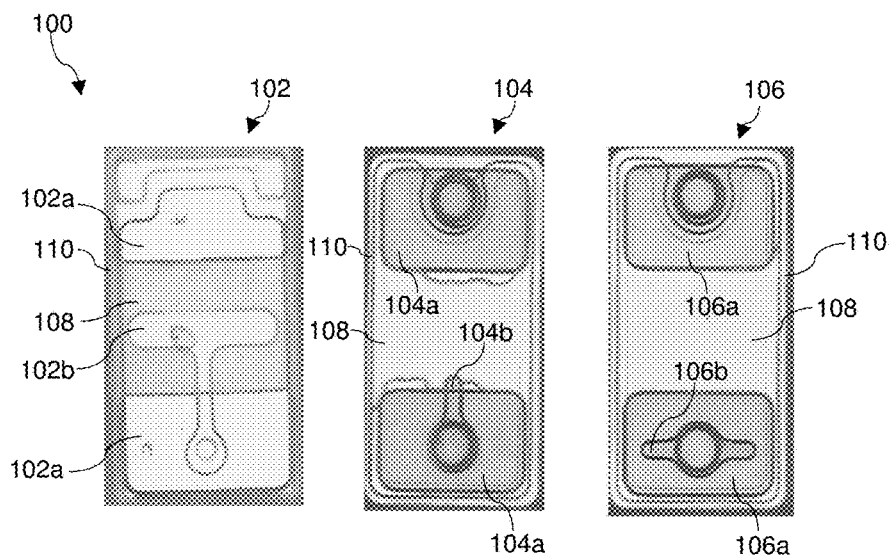
FIG. 1A shows a top view of respective RGB LED dies as captured by an optical microscope and FIG. 1B shows a cross-sectional view of an LED die from FIG. 1A.
Figure 1B:
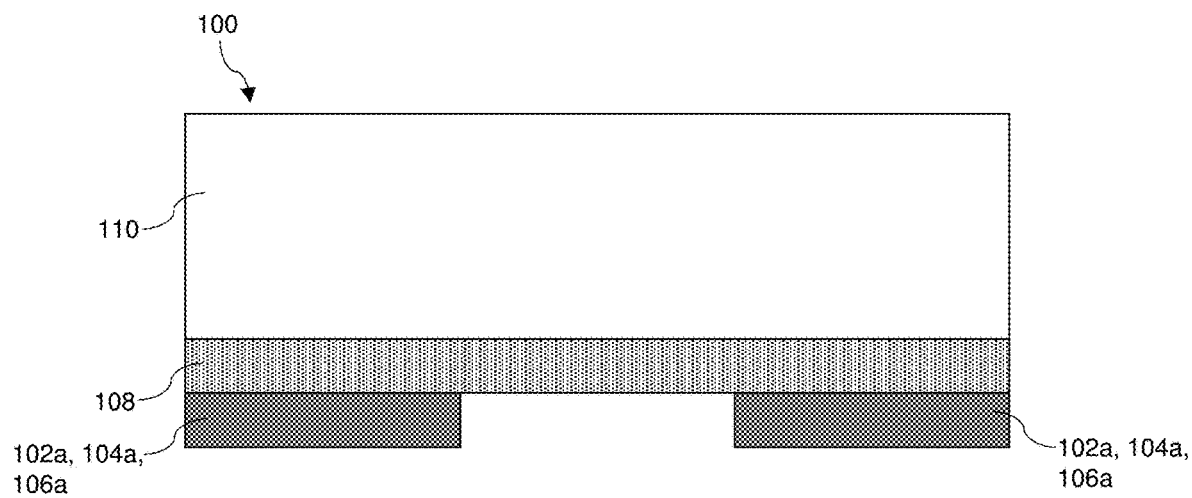
Figure 2A:
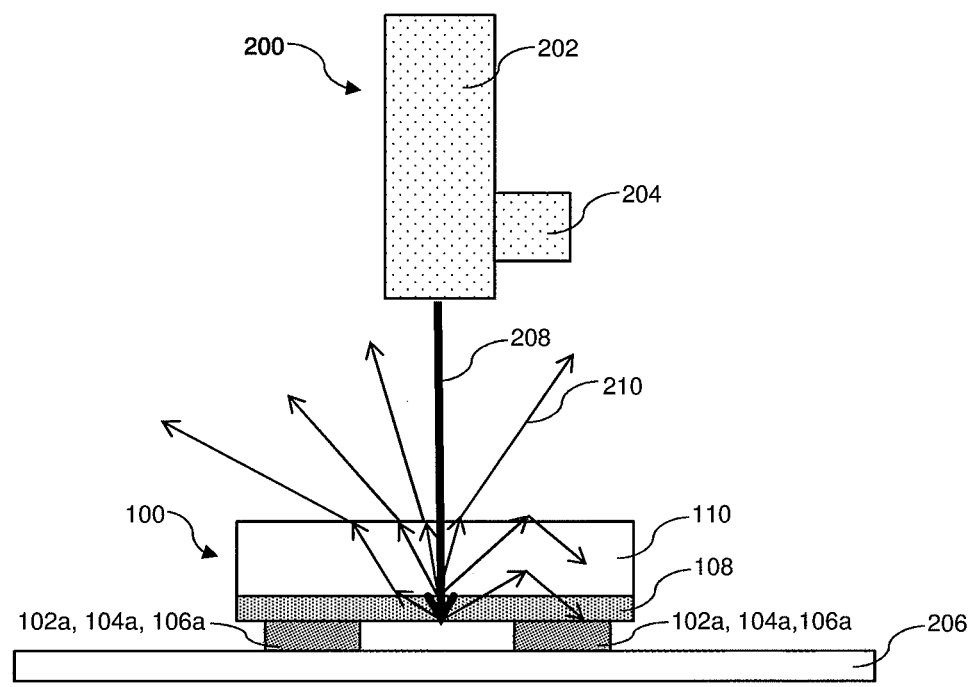
FIG. 2A shows a cross-sectional view of a prior art apparatus configured to determine an orientation of the LED die of FIGS. 1A-1B.
Figure 2B:
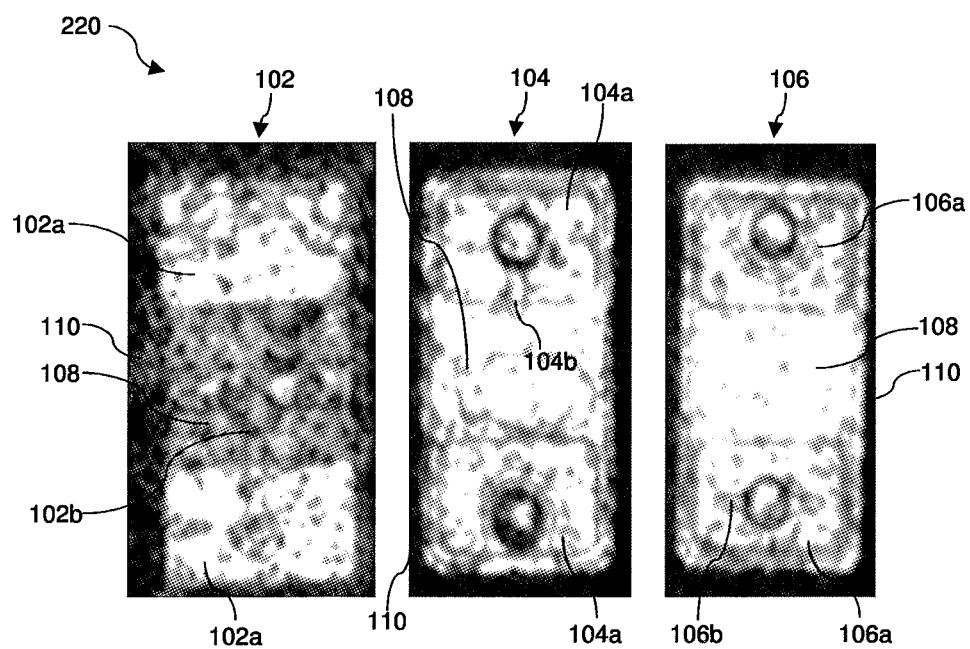
FIG. 2B shows an example of images of the LED dies of FIG. 1A captured by a camera of the prior art apparatus of FIG. 2A.
Figure 4:
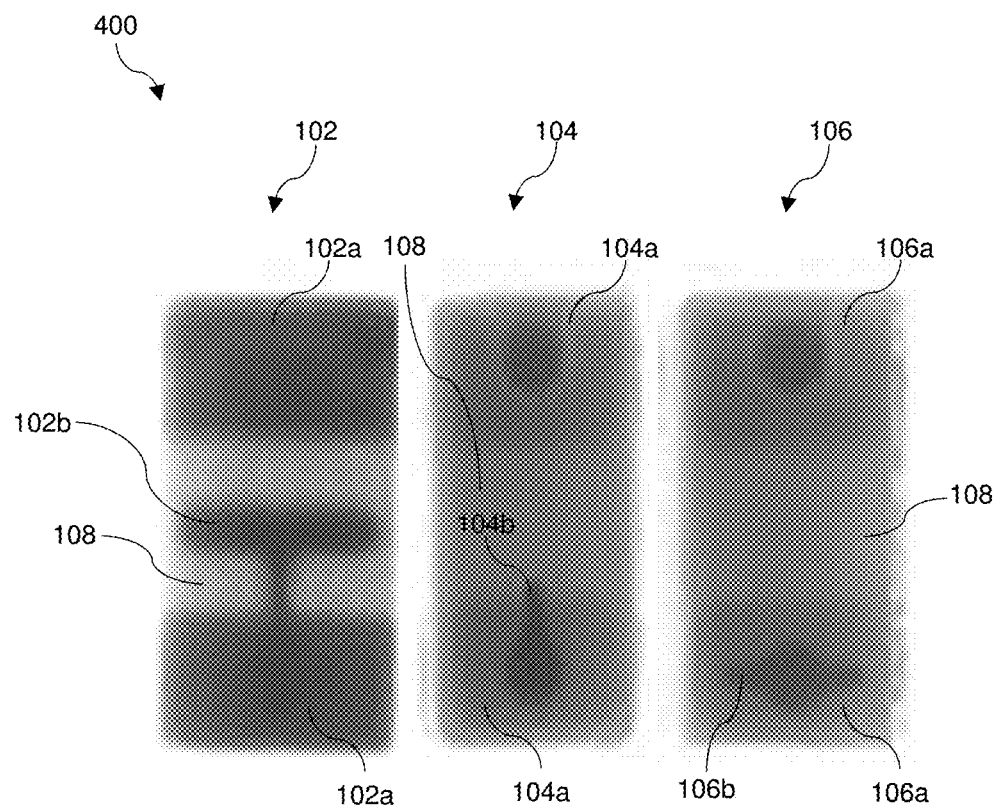
FIG. 4 shows an example of an image captured by an imaging device of the apparatus of FIG. 3.

FIG. 4 shows an example of images 400 captured by the imaging device 308 when each of the respective dies 302 is an LED die 100 as shown in FIGS. 1A and 1B. As shown in FIG. 4, the images 400 of the respective dies 302 contain less noise and thus, more clearly show the orientation features 102b, 104b, 106b as compared to the images 220 in FIG. 2B captured by the prior art apparatus 200.

Various modifications may be made to the above-described embodiments.

For example, although the general lighting provided by the lighting module 310 can further increase the intensity of light reaching the imaging device 308, such general lighting may be omitted. For example, the apparatus 300 may not include the lighting module 310. Alternatively, the apparatus 300 may include the lighting module 310 but the lighting module 310 may be turned off during operation of the apparatus 300.

Also, the light source need not include a plurality of light emitting elements 312 and may instead include a single light emitting element 312. The single light emitting element 312 may be arranged below the opening 322 of the holding unit 316 along the axis 324.

In addition, the light source, the imaging device 308 and the holding unit 316 need not be arranged in the manner as shown in FIG. 3, and may be arranged in an alternative manner as long as the at least one orientation feature of the die 302 can block the light rays 314 from the light source to the imaging device 308. For example, the light source may instead be arranged above the tape 304 and the imaging device 308 may instead be arranged below the tape 304. Further, instead of being arranged along the vertical axis 324 perpendicular to the tape 304, the imaging device 308 and the opening 322 of the holding unit 316 may be arranged along an axis at a different angle with respect to the tape 304.

The plurality of light emitting elements 312 also need not be arranged in the manner shown in FIG. 3. Each light emitting element 312 may instead be arranged at a different angle relative to the axis 324 as long as the light projected from the light emitting element 312 can pass through the opening 322 of the holding unit 316. In addition, the light emitting elements 312 need not be arranged symmetrically about the axis 324.

Each light emitting element 312 may be in the form of an LED device, a laser diode or any other type of element capable of projecting light through the die 302. Further, the light projected by each light emitting element 312 may be white light or other types of light. Also, the wavelength of the light projected by the light source may vary. For example, to achieve better image quality, the wavelength of the projected light may be adjusted based on the transmittance of the materials used to form the die 302.

Figure 5:
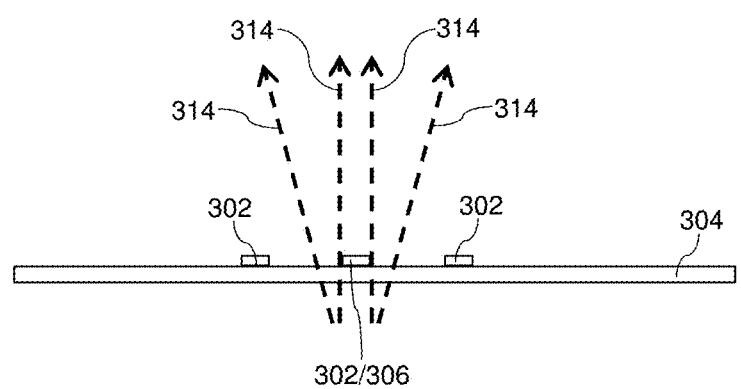
FIG. 5 illustrates a projected plurality of light rays forming a fan shape.

In addition, the projected plurality of light rays 314 need not intersect one another above the die 302. Instead, the projected plurality of light rays 314 may intersect one another at any position along the axis 324. In some embodiments, the projected plurality of light rays 314 may even be spaced apart from one another. For example, as shown in FIG. 5, the projected plurality of light rays 314 may form a fan shape.

Furthermore, the holding unit 316 may be arranged at any position below the tape 304 as long as the light projected by the light source within the holding unit 316 can pass through the die 302 at the inspection position 306 to reach the imaging device 308. For example, the holding unit 316 may be arranged such that a distance 326 (see FIG. 3) between the inspection position 306 and the opening 322 of the holding unit 316 ranges from 0 mm (in other words, the top surface of the cover 318 is in contact with the tape 304) to 2 mm.

Also, the holding unit 316 need not be an ejector unit and may be other types of units including an opening at a top surface for the light projected by the light source to pass through. In addition, the holding unit 316 need not include only a single opening 322 but may instead include a plurality of openings, where the openings are positioned so that the light projected by the light source can pass through the die 302 at the inspection position 306 to reach the imaging device 308. Also, the imaging device 308 may be in the form of a charge-coupled device (CCD) or may instead be in the form of other types of imaging devices.

Figure 6:
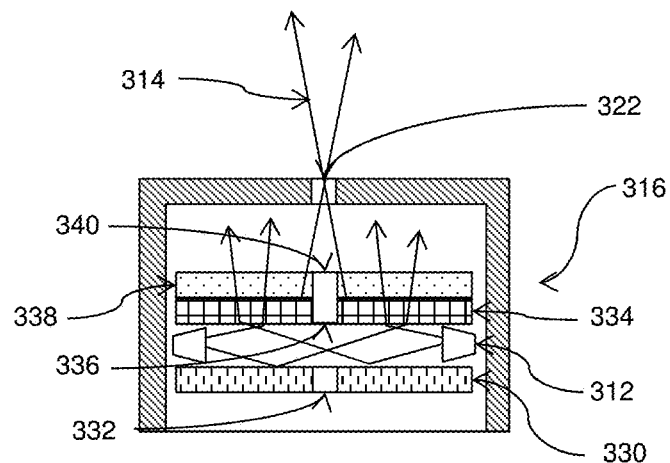
FIG. 6 is an embodiment of a holding unit of the apparatus which incorporates a light diffuser in the holding unit.

FIG. 6 is an embodiment of a holding unit 316 of the apparatus 300 which incorporates a light diffuser 338 in the holding unit 316. This embodiment of the holding unit 316 is also has an opaque cover, but the light emitting elements 312 are generally arranged such that light rays emitted by the light emitting elements 312 are directed horizontally. A light reflector 330 is arranged below the light emitting elements 312 to direct the emitted light rays upwards. The light reflector 330 includes a reflector opening 332 for an ejector pin 320 to pass through.

A collimator light guide 334 is positioned above the light emitting elements 312 so as to collimate the emitted light rays and direct them towards a light diffuser 338, which is operative to diffuse any light that is perpendicular to an optical path which is directed towards the opening 322 of the holding unit 316. Thus, light rays 314 propagated from the light diffuser 338 are directed primarily towards the opening 322. This feature may reduce scattering and refraction of light rays 314 by the die 302, and helps to improve the contrast in the captured image. The collimator light guide 334 and the light diffuser 338 respectively contain a light guide opening 336 and a diffuser opening 340 for an ejector pin 320 to pass through.

By projecting the plurality of light rays 314 only though the opening 322, the illumination can be more precise as only the target die 302 is illuminated. This may improve the contrast of the captured image. However, it is also possible to illuminate a larger area which includes other dies, so that multiple dies may be inspected simultaneously.

Figure 7:
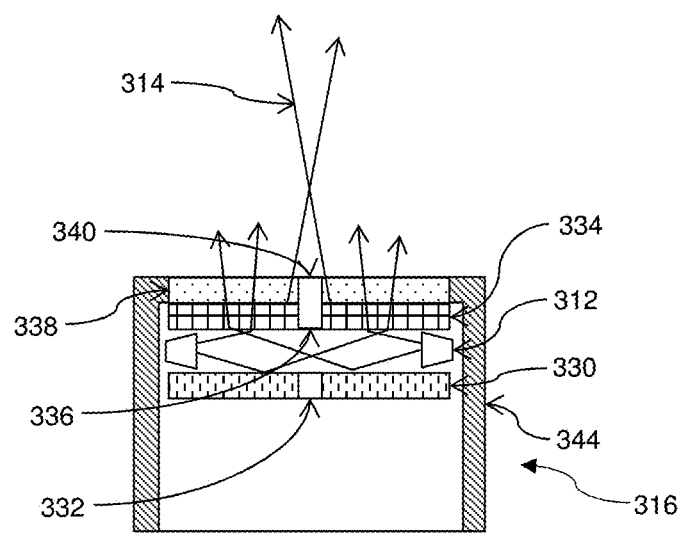
FIG. 7 is an embodiment of the holding unit of the apparatus where a surface of the holding unit comprises a light diffuser.

FIG. 7 is an embodiment of the holding unit 316 of the apparatus 300 where a surface of the holding unit 316 comprises a translucent body in the form of a light diffuser 338. The light emitting elements 312 are generally arranged such that light rays emitted by the light emitting elements 312 are directed horizontally. A light reflector 330 is arranged below the light emitting elements 312 to direct the emitted light rays upwards. The light reflector 330 includes a reflector opening 332 for an ejector pin 320 to pass through.

A collimator light guide 334 is positioned above the light emitting elements 312 so as to collimate the emitted light rays and direct them towards the light diffuser 338, which is operative to diffuse any light that is perpendicular to an optical path which is directed towards the imaging device 308. Thus, light rays 314 propagated from the light diffuser 338 are directed primarily in directions towards the imaging device 308. In this embodiment, the light diffuser 338 forms a translucent top surface of the holding unit 316, whereas opaque side walls 344 surround a perimeter of the holding unit 316. Similar to the previous embodiment, the collimator light guide 334 and the light diffuser 338 respectively contain a light guide opening 336 and a diffuser opening 340 for an ejector pin 320 to pass through.

Figure 8A:
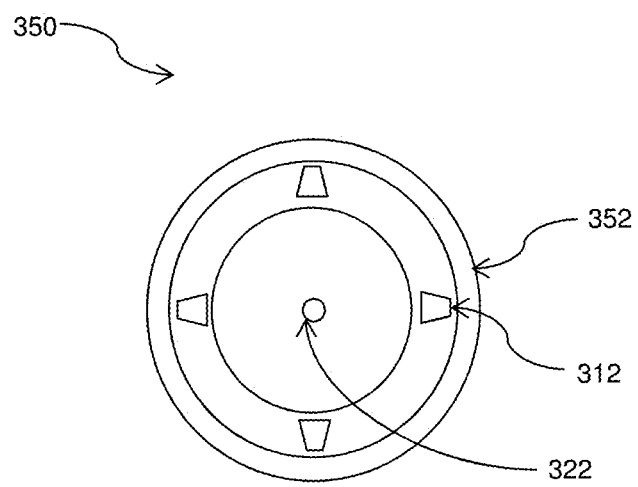
FIGS. 8A-8B are a top view and side cross-sectional view of a holding unit having a translucent body.

FIG. 8A is a top view of a holding unit 350 having a translucent body. The holding unit 350 has an opening 322 at its center for an ejector pin 320 to pass through, and light emitting elements 312 located beneath a top surface of the holding unit 350. The holding unit substantially comprises a translucent body 352.

Figure 8B:
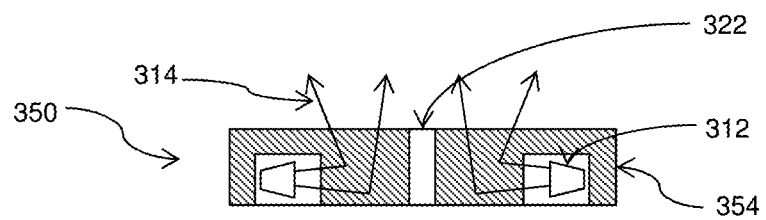

FIG. 8B is a side cross-sectional view of the holding unit 350. The light emitting elements 312 are generally arranged such that light rays emitted by the light emitting elements 312 are directed horizontally. The light emitting elements 312 are housed within a translucent body in the form of a light diffuser 354, such that the holding unit 350 appears translucent. Whilst light rays are projected generally horizontally from the light emitting elements 312, the light diffuser 354 is operative to diffuse any light that is perpendicular to an optical path which is directed towards the imaging device 308. Thus, light rays 314 propagated from the light diffuser 338 are directed primarily in directions along an optical path between the holding unit 350 and the imaging device 308, towards the imaging device 308.

A benefit of the embodiments as illustrated in FIGS. 7, 8A and 8B is that light is projected from an entire top surface of the respective holding unit 316, 350, and such larger projection area allows orientations of multiple dies 302 to be inspected in one image captured by the imaging device 308.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for determining an orientation of a die mounted on a tape, wherein the die is at least partially translucent and comprises at least one orientation feature indicative of the orientation of the die, and wherein the apparatus comprises:
   an imaging device configured to capture an image of the die;
   a light source configured to project light towards the imaging device;
   a holding unit configured to hold the light source, wherein the holding unit comprises an opening and the light source is configured to project the light through the opening, and wherein the holding unit is an ejector unit operative to urge the die away from the tape; and
   a conveying mechanism operative to convey the tape to position the die at an inspection position between the imaging device and the light source, such that the projected light from the light source passing through the die is obstructed by the at least one orientation feature of the die to cause the captured image to include an image of the at least one orientation feature, whereby the orientation of the die is determinable.

2. The apparatus according to claim 1, wherein the ejector unit comprises an ejector pin, and the ejector pin is operative to move through the opening to contact the die to urge the die away from the tape.

3. The apparatus according to claim 1, wherein the imaging device and the inspection position lie within a viewing cone centered at the opening of the holding unit.

4. The apparatus according to claim 1, wherein the imaging device, the inspection position and the opening of the holding unit are arranged along an axis perpendicular to the tape.

5. The apparatus according to claim 1, wherein the imaging device and the light source are arranged on opposite sides of the tape.

6. The apparatus according to claim 5, wherein the light source is arranged below the tape and the imaging device is arranged above the tape.

7. The apparatus according to claim 1, wherein the light source comprises a plurality of light emitting elements configured to project a plurality of light rays.

8. The apparatus according to claim 7, wherein the projected plurality of light rays intersect one another.

9. The apparatus according to claim 8, wherein the projected plurality of light rays intersect one another above the die at the inspection position.

10. The apparatus according to claim 7, wherein the projected plurality of light rays are spaced apart from one another.

11. The apparatus according to claim 10, wherein the projected plurality of light rays form a fan shape.

12. The apparatus according to claim 7, further comprising:
- a light reflector arranged below the plurality of light emitting elements and configured to direct the plurality of light rays towards the imaging device;
- a collimator light guide operative to collimate the light rays reflected from the light reflector; and
- a light diffuser operative to diffuse any light rays that are perpendicular to an optical path between the holding unit and the imaging device.

13. The apparatus according to claim 7, wherein the light emitting elements are arranged symmetrically about an axis along which the imaging device, the inspection position and the opening of the holding unit are arranged.

14. The apparatus according to claim 1, wherein a distance between the inspection position and the opening of the holding unit ranges from 0 mm to 2 mm.

15. The apparatus according to claim 1, wherein a surface of the holding unit comprises a translucent body having a translucent top surface, the translucent body being operative to project the light to pass through an area comprising a plurality of dies, whereby orientations of the plurality of dies is determinable simultaneously.

16. The apparatus according to claim 15, wherein the translucent body comprises a light diffuser operative to diffuse any light rays that are perpendicular to an optical path between the holding unit and the imaging device and to direct the light rays primary along the optical path.

17. The apparatus according to claim 1, wherein the light source is arranged below the tape and the imaging device is arranged above the tape.

* * * * *